United States Patent [19]
Kohge et al.

[11] Patent Number: 5,602,451
[45] Date of Patent: Feb. 11, 1997

[54] ELECTRIC POWER STEERING CIRCUIT DEVICE

[75] Inventors: Shinichi Kohge; Shunichi Wada, both of Himeji, Japan

[73] Assignee: Mitsubishi Denki Kabushiki Kaisha, Tokyo, Japan

[21] Appl. No.: 496,163

[22] Filed: Jun. 28, 1995

[30] Foreign Application Priority Data

Jun. 30, 1994 [JP] Japan .................................... 6-149617

[51] Int. Cl.$^6$ ................................ B62D 5/04; H05K 3/30
[52] U.S. Cl. ........................ 318/293; 361/690; 361/711; 361/717
[58] Field of Search ..................................... 318/254, 256, 318/280, 287, 293, 139; 361/600, 679, 688, 690, 704, 707, 709, 711, 717, 718, 719, 720, 722, 748, 807

[56] References Cited

U.S. PATENT DOCUMENTS

| | | |
|---|---|---|
| 3,530,350 | 9/1970 | Gawron et al. . |
| 3,531,702 | 9/1970 | Hill . |
| 4,218,724 | 8/1980 | Kaufman ................................ 361/395 |
| 4,668,898 | 5/1987 | Harms et al. . |
| 4,872,102 | 10/1989 | Getter . |
| 4,942,380 | 7/1990 | Bradford et al. ........................ 335/301 |
| 5,012,173 | 4/1991 | Fujioka et al. . |
| 5,497,289 | 3/1996 | Sugishima et al. . |

FOREIGN PATENT DOCUMENTS

| | | |
|---|---|---|
| 0361726 | 4/1990 | European Pat. Off. . |
| 63-162370 | 7/1988 | Japan . |

*Primary Examiner*—Bentsu Ro
*Attorney, Agent, or Firm*—Sughrue, Mion, Zinn, Macpeak & Seas

[57] ABSTRACT

An electric power steering circuit device comprising a microcomputer, a bridge circuit for switching, a motor current output by a battery to drive a motor based on an output signal from the microcomputer, wiring patterns for flowing a large current, an insulated printed-circuit board for mounting the microcomputer, and a heat radiating plate for mounting thereon on the semiconductor switching elements. The bridge circuit includes a plurality of semiconductor switching elements, and the wiring patterns comprise metal plates fixed by molding. The heat radiating plate and the insulation printed-circuit board are overlapped through a predetermined space.

9 Claims, 4 Drawing Sheets

ELECTRIC POWER STEERING CIRCUIT DEVICE

BACKGROUND OF THE INVENTION

Field of the Invention

The present invention relates to an electric power steering circuit device which drives and controls a motor by a bridge circuit to generate assisting steering torque for assisting a steering motion of the steering wheel of a vehicle in accordance with the speed of the vehicle, and more particularly to an electric power steering circuit device in which a support member integral with a connector is integrally formed with wiring patterns to achieve device miniaturization and reduce production cost.

Description of the Related Art

FIG. 3 is a circuit diagram showing a general electric power steering circuit device. In the figure, a motor 40 for outputting an assisting torque to the steering wheel (not shown) of a vehicle is supplied with a motor current IM by a battery 41 and driven.

The ripple component of the motor current IM is absorbed by a large capacity (about 3600 μF) capacitor 42 and is detected by a shunt resistor 43. Also, the motor current IM is switched according to the magnitude and direction of an assisting torque by a bridge circuit 44 comprising a plurality of semiconductor switching elements (for example, FETs) Q1 to Q4.

The capacitor 42 is connected at its one end to ground through a conductive line L1. The semiconductor switching elements Q1 to Q4 are bridge-connected by wiring patterns P1 and P2 and constitute the bridge circuit 44. Also, these wiring patterns P1 and P2 connect this bridge circuit 44 to the shunt resistor 43. The output terminal of the bridge circuit 44 is constituted by a wiring pattern P3.

The motor 40 and the battery 41 are connected to the bridge circuit 44 through a connector 45 comprising a plurality of lead terminals. The motor 40, the battery 41 and the connector 45 are connected through an external wiring L2. The motor current IM is interrupted as needed by a normally open relay 46. The relay 46, the capacitor 42, and the shunt resistor 43 are interconnected through a wiring pattern P4. The connector 45 is connected to ground through a wiring pattern P5. The wiring pattern P3 which becomes the output of the bridge circuit 44 is connected to the connector 45.

The motor 40 is driven through the bridge 44 by a drive circuit 47. Also, this drive circuit 47 drives the relay 46. The drive circuit 47 is connected through a conductive line L3 to the exciting coil of the relay 46 and through a conductive line L4 to the bridge circuit 44. The motor current IM is detected by motor current detection means 48 through the opposite ends of the shunt resistor 43. The drive circuit 47 and the motor current detection means 48 constitute the peripheral circuit elements of a microcomputer to be described later.

The steering torque T of the steering wheel is detected by a torque sensor 50, and the speed or velocity V of the vehicle is detected by a speed or velocity sensor 51.

The microcomputer 55 (ECU) calculates an assisting torque based on the steering torque T and the vehicle speed V, and generates a drive signal corresponding to the assisting torque, based on the motor current IM fed back thereto. A rotational direction command Do and a current control quantity Io for controlling the bridge circuit 44 are output as drive signals to the drive circuit 47.

The microcomputer 55 comprises motor current decision means 56 for generating a motor current command Im corresponding to the rotational direction command Do and assisting torque of the motor 40, subtraction means 57 for outputting a current deviation ΔI between the motor current command Im and the motor current IM, and PID calculation means 58 for calculating correction quantities of P (proportion), I (integration), and D (differentiation) terms from the current deviation ΔI to generate a current control quantity Io corresponding to a PWM duty ratio.

Also, the microcomputer 55 includes an AD converter and a PWM timer, and it has a known self-diagnosis function, although they are not shown. The microcomputer 55 always performs a self-diagnosis if the system operates normally, and if an abnormality occurs, will open the relay 46 through the drive circuit 47 to interrupt the motor current IM. The microcomputer 55 is connected to the drive circuit 47 through a conductive line L5.

In general, the circuit elements 42 to 44, wiring patterns P1 to P5, and conductive lines L1 and L2 interposed between the motor 40 and the battery 41 are of increased size so that they can correspond to the motor current IM of a large current, taking in consideration of their heat-radiating properties (heat-resisting properties) and durability, as will be described later. On the other hand, the microcomputer 55, peripheral circuit elements including the drive circuit 47 and the motor current detection circuit 48, and the conductive lines L3 to L5 are reduced in size so that they can correspond to small currents and meet higher density requirements.

FIG. 4 is a plan view showing the structure of a conventional electric power steering circuit device, and Q1 to Q4, 42 to 45, and 55 are the same as those shown in FIG. 3. In FIG. 4, each of the semiconductor switching elements Q1 to Q4 is constituted by a pair of field-effect transistors (FETs) covered with resin, the large capacity capacitor 42 is constituted by three capacitors, and the microcomputer 55 is constituted by a one-chip integrated circuit. Also, peripheral circuit elements, wiring patterns, and conductive lines are omitted to reduce the complexity of illustration, and only representative structural elements are shown.

An insulated printed-circuit board 2 is mounted on the bottom surface of a box-shaped metal frame 1 which functions both as a shielding plate and a heat radiating plate. On the inner side face of the metal frame 1 there is joined one end face of each of heat radiating plates 3 made of, for example, aluminum. The circuit elements 42 to 45 and 55 are mounted on the insulated printed-circuit board 2. The semiconductor switching elements Q1 to Q4 are joined to the other end faces of the heat radiating plates 3.

Conductive plates 4a to 4e correspond to the wiring patterns P1 to P5, respectively. For these conductive plates, conductive plates wider and thicker than other wiring patterns on the insulated printed-circuit board 2 are used to exclusively correspond to a large current.

Next, the operation of the conventional electric power steering circuit device shown in FIG. 4 will be described while referring to FIG. 3.

The steering torque T detected by the torque sensor 50 and the speed V detected by the speed sensor 51 are input to the microcomputer 55, and also the motor current IM from the shunt resistor 43 is fed back to the microcomputer 55. Based these inputs, the microcomputer 55 generates a rotational direction command Do for the power steering and a current control quantity Io corresponding to an assisting torque quantity, and outputs them to the drive circuit 47 through the conductive line L5.

The drive circuit 47 closes, in its steady drive state, the normally open relay 46 by its command through the conductive line L3. If a rotational direction command Do and a current control quantity Io are input, the drive circuit 47 will generate a PWM drive signal and apply it to each of the semiconductor switching elements Q1 to Q4 of the bridge circuit 44 through the conductive line L4.

With this, the motor current IM is supplied from the battery 41 to the motor 40 through the external wiring L2, the connector 45, the relay 46, the wiring pattern P4, the shunt resistor 43, the wiring pattern P1, the bridge circuit 44, the wiring pattern P3, the connector 45, and the external wiring L2. The motor 40 is driven by this motor current IM and outputs a predetermined quantity of assisting torque in a predetermined direction.

At this time, the motor current IM is detected via the shunt resistor 43 and the motor current detection means 48 and fed back to the subtraction means 57 of the microcomputer 55 so that it matches with the motor current command Im output by the motor current decision means 56. Also, the motor current IM includes the ripple component caused by the switching operation as the bridge circuit 44 is PWM-driven, but it is smoothed and controlled by the large capacity capacitor 42.

However, the value of the motor current IM controlled by this kind of electric power steering circuit device is about 25 A even for a sub-compact automobile and reaches about 60 to 80 A for a compact automobile. Therefore, the semiconductor switching elements Q1 to Q4 constituting the bridge circuit 44 need to be increased in size according to the magnitude of the motor current IM, and as shown, a plurality of semiconductor switching elements need to be connected in parallel so that the generation of heat while they are on or PWM-switched can be reduced.

Also, the above-described heat radiating plates 3 are needed in order to radiate the heat generated by the semiconductor switching elements Q1 to Q4. As the motor current IM increases, the semiconductor switching elements Q1 to Q4 must be increased in number and at the same time the heat radiating plates 3 must be increased in size.

Further, the wiring patterns P1, P2 and P4 leading from the terminals of the connector 45 through the relay 46, the shunt resistor 43, and the bridge circuit 44 to ground and the wiring pattern P3 leading from the bridge circuit 44 to the motor 40 become longer physically in proportion to increases in the motor current IM, the number of the semiconductor switching elements Q1 to Q4, and the size of the heat radiating plates 3.

Consequently, if a rise in temperature becomes greater because of the generation of heat caused by a voltage drop on each of the wiring patterns P1 to P5, there is the possibility that the heat-resisting properties and durability of the wiring patterns P1 to P5 will be deteriorated. Therefore, in the conventional electric power steering circuit device, in order to prevent this, the wiring plates 4a to 4e with large widths and thicknesses are exclusively used for a large current as shown in FIG. 4. Therefore, this causes an increase in size of the insulated printed-circuit board 2.

Also, the capacitor 42, the shunt resistor 43, and the relay 46 are increased in size as the motor current IM becomes greater, and if these are mounted on the insulated printed-circuit board 2, an increase in the mounting space will cause an increase in size of the insulated printed-circuit board 2.

As described above, in the conventional electric power steering circuit device, the capacitor 42, shunt resistor 43, bridge circuit 44, heat radiating plate 3, and wiring plates 4a to 4e (wiring patterns P1 to P5) which correspond to a large current have been mounted on the insulated printed-circuit board 2, so the insulated printed-circuit board 2 is also increased in size as the circuit elements 42 to 44 and the wiring patterns P1 to P5 are increased in size. As a result, there is the problem that the device weight is increased, the cost is increased, and the ability to mount elements on the device is deteriorated.

SUMMARY OF THE INVENTION

This invention has been made to solve the problems described above. Accordingly, the object of the present invention is to provide an electric power steering circuit device which can be reduced in size and in cost.

To achieve this end, there is provided according to one aspect of this invention an electric power steering circuit device comprising a microcomputer and a bridge circuit including a plurality of semiconductor switching elements for switching a motor current output by a battery to drive a motor based on an output signal from the microcomputer. The device further comprises wiring patterns for flowing a large current, an insulated printed-circuit board for mounting thereon the microcomputer, and a heat radiating plate for mounting thereon the semiconductor switching elements. The wiring patterns comprise metal plates fixed by molding, and the heat radiating plate and the insulated printed-circuit board are overlapped through a predetermined space. With this arrangement, the generation of heat of the semiconductor switching elements caused by an increase in the motor current is effectively radiated through the heat radiating plate. As a result, the electric power steering circuit can be reduced in size and in cost.

In a preferred form of this invention, a support member for maintaining the predetermined space is provided between the heat radiating plate and the insulated printed-circuit board and fixedly holds the metal plates. With this arrangement, the assembling of the electric power steering circuit device becomes easier.

According to another aspect of this invention, there is provided an electric power steering circuit device comprising: a motor for outputting an assisting torque to a steering wheel of a vehicle; a battery for supplying a motor current to drive the motor; a capacitor for absorbing a ripple component of the motor current supplied by the battery; a shunt resistor for detecting the motor current; a bridge circuit for switching the motor current according to the assisting torque, the bridge circuit including a plurality of semiconductor switching elements; wiring patterns for bridge connecting the plurality of semiconductor switching elements and also connecting the shunt resistor and the bridge circuit, the wiring patterns comprising metal plates fixedly held by molding; a connector for connecting the motor and the battery to the bridge circuit; a torque sensor for sensing a steering torque of the steering wheel; a speed sensor for sensing a speed of the vehicle; a microcomputer with peripheral circuit elements for calculating the assisting torque based on the steering torque of the steering wheel and the speed of the vehicle and for generating, based on the motor current fed back thereto, a drive signal for controlling the bridge circuit; conductive lines for connecting the microcomputer and the peripheral circuit elements to the bridge circuit; an insulated printed-circuit board for mounting thereon the microcomputer and the peripheral circuit elements; and a heat radiating plate for mounting thereon the semiconductor switching elements, the heat radiating plate and the insulated printed-circuit board being overlapped through a predetermined space. With this arrangement, the generation of heat of the semiconductor switching elements caused by an increase in the motor current is effectively radiated through the heat radiating plate. As a result, the electric power steering circuit can be reduced in size and in cost.

In a preferred form of this invention, a support member for maintaining the predetermined space is provided between the heat radiating plate and the insulated printed-circuit board and fixedly holds the metal plates. With this arrangement, the assembling of the electric power steering circuit device becomes easier.

In another preferred form of this invention, the capacitor and the shunt resistor are attached to the wiring patterns fixedly held by the support member. With this arrangement, the assembling of the electric power steering circuit device becomes easier.

In a further preferred form of this invention, the connector is integrally formed with the support member and has extension terminal portions, and the extension terminal portions of the wiring patterns and are connected to leads of the semiconductor switching elements mounted on the heat radiating plate. With this arrangement, the assembling of the electric power steering circuit device becomes easier.

In a further preferred form of this invention, the conductive lines comprise a flexible substrate. With this arrangement, the assembling of the electric power steering circuit device becomes easier.

In a further preferred form of this invention, the insulated printed-circuit board is covered with a shielding plate for shielding electromagnetic noise. With this arrangement, the assembling of the electric power steering circuit device becomes easier.

In a further preferred form of this invention, at least part of the peripheral circuit elements are arranged on the flexible substrate. With this arrangement, the assembling of the electric power steering circuit device becomes easier.

DETAILED DESCRIPTION OF THE PREFERRED EMBODIMENTS

Embodiments of this invention will hereinafter be described with reference to the accompanying drawings.
Embodiment 1

Figure 1:
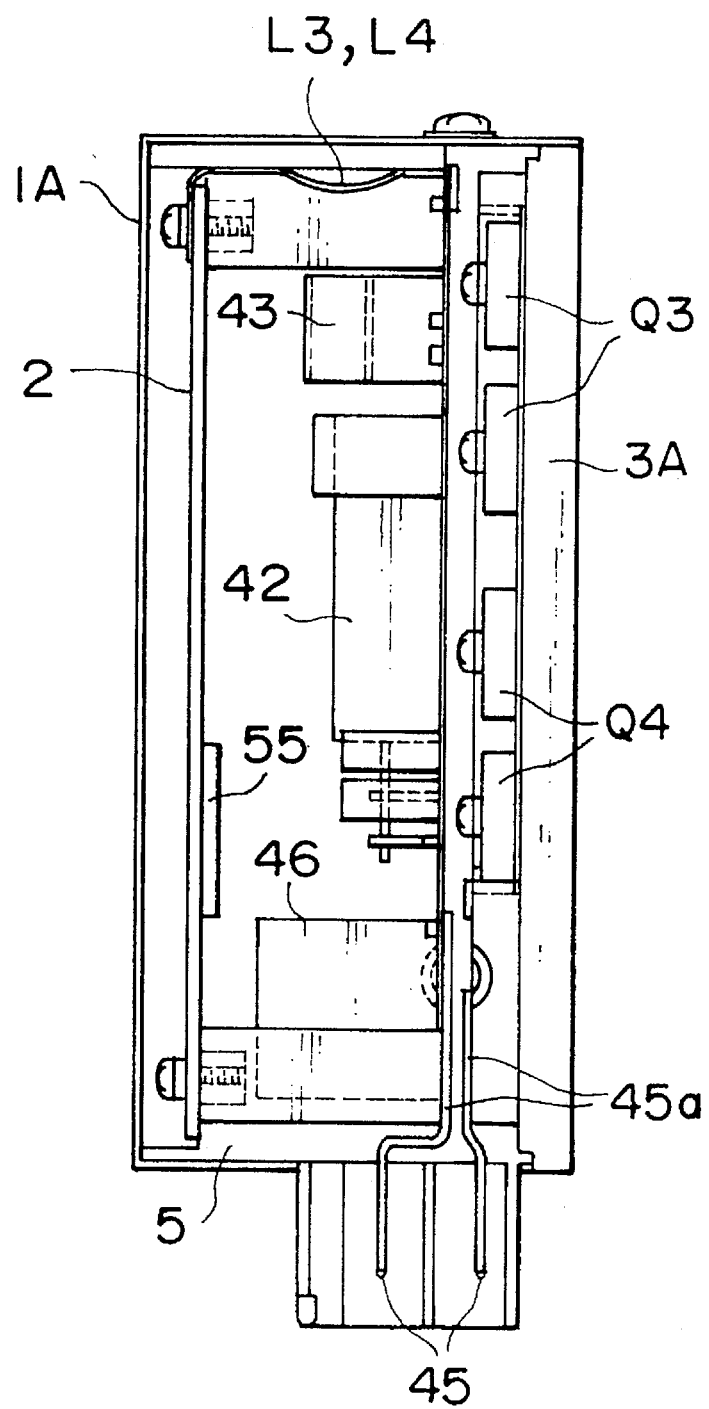
FIG. 1 is a cross sectional view showing an electric power steering circuit device of an embodiment of this invention.
Figure 2:
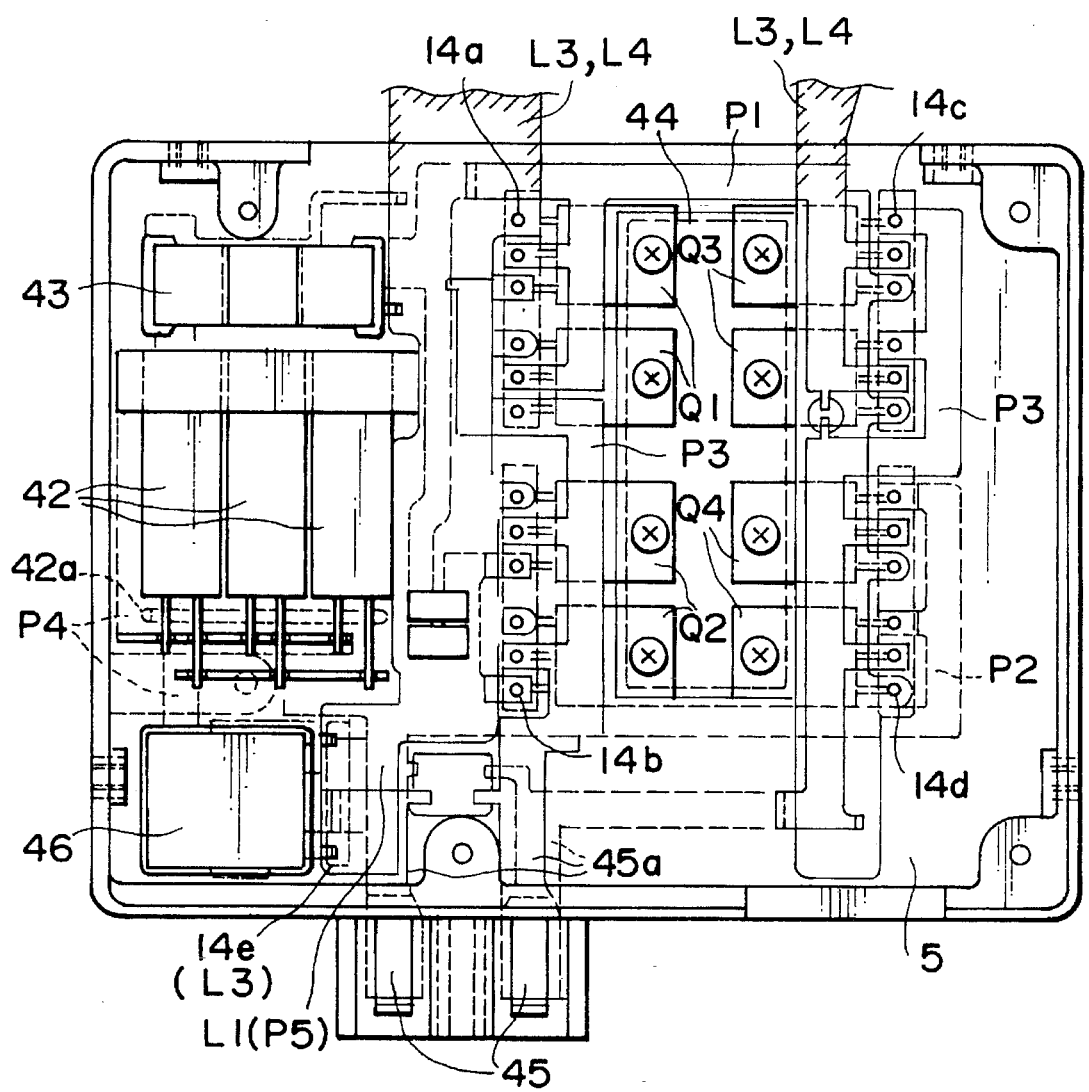
FIG. 2 is a plan view showing the electric power steering circuit device of the embodiment of the invention.

FIG. 1 illustrates in cross section the structure of a first embodiment of this invention, and FIG. 2 illustrates the embodiment with an insulated printed-circuit board 2 being removed. In FIGS. 1 and 2, Q1 to Q4, 42 to 46, 55, L1, L3, and L4 are the same as those described in FIGS. 3 and 4, and 1A and 3A correspond to the metal frame and the heat radiating plate 3 of the conventional device of FIGS. 3 and 4, respectively. It is to be noted that the circuit constitutions not shown and ordinary circuit operation are the same as that described in FIGS. 3 and 4 and therefore description thereof will not be given here.

Figure 3:
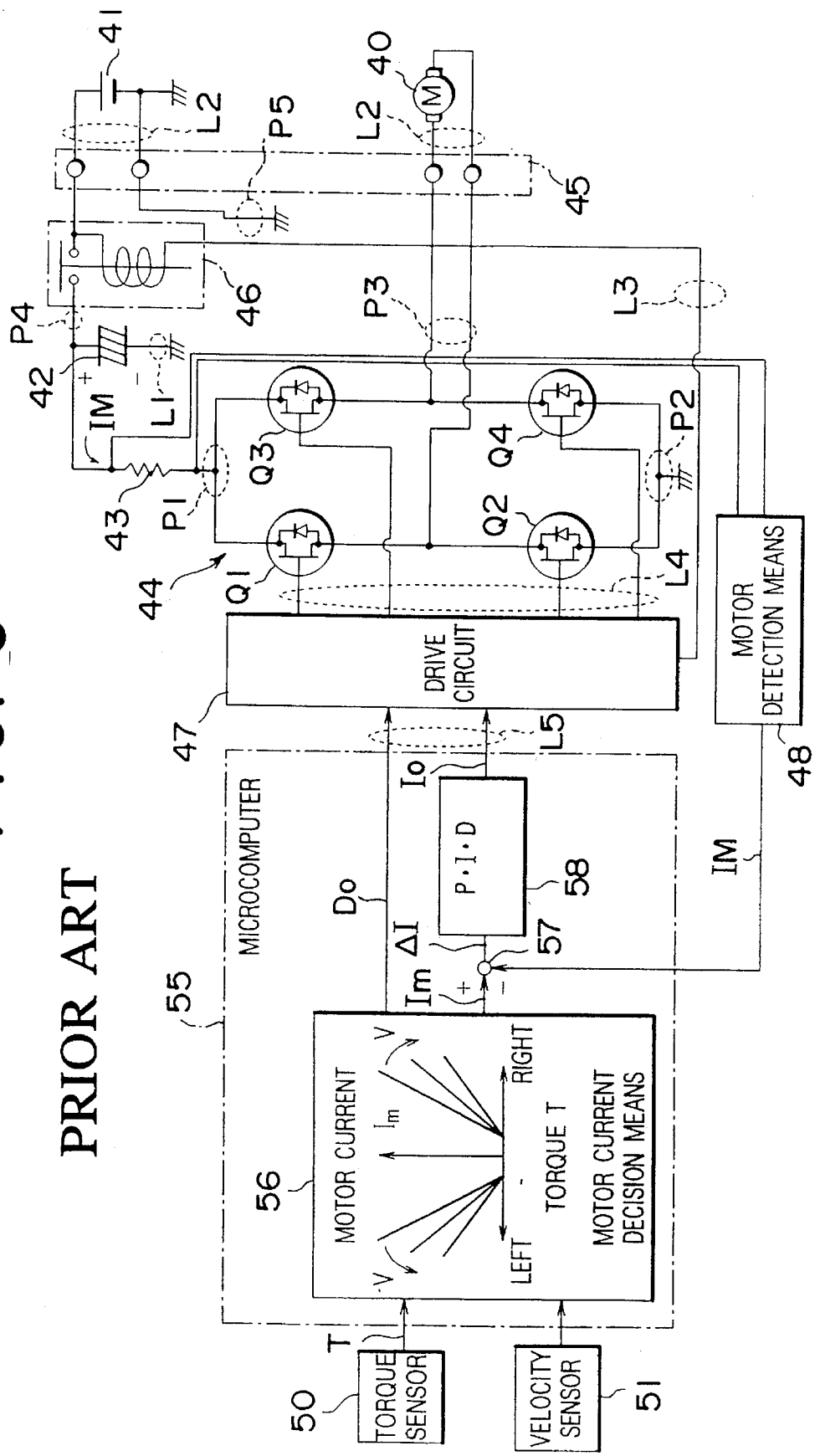
FIG. 3 is a circuit diagram showing a general electric power steering circuit device.
Figure 4:
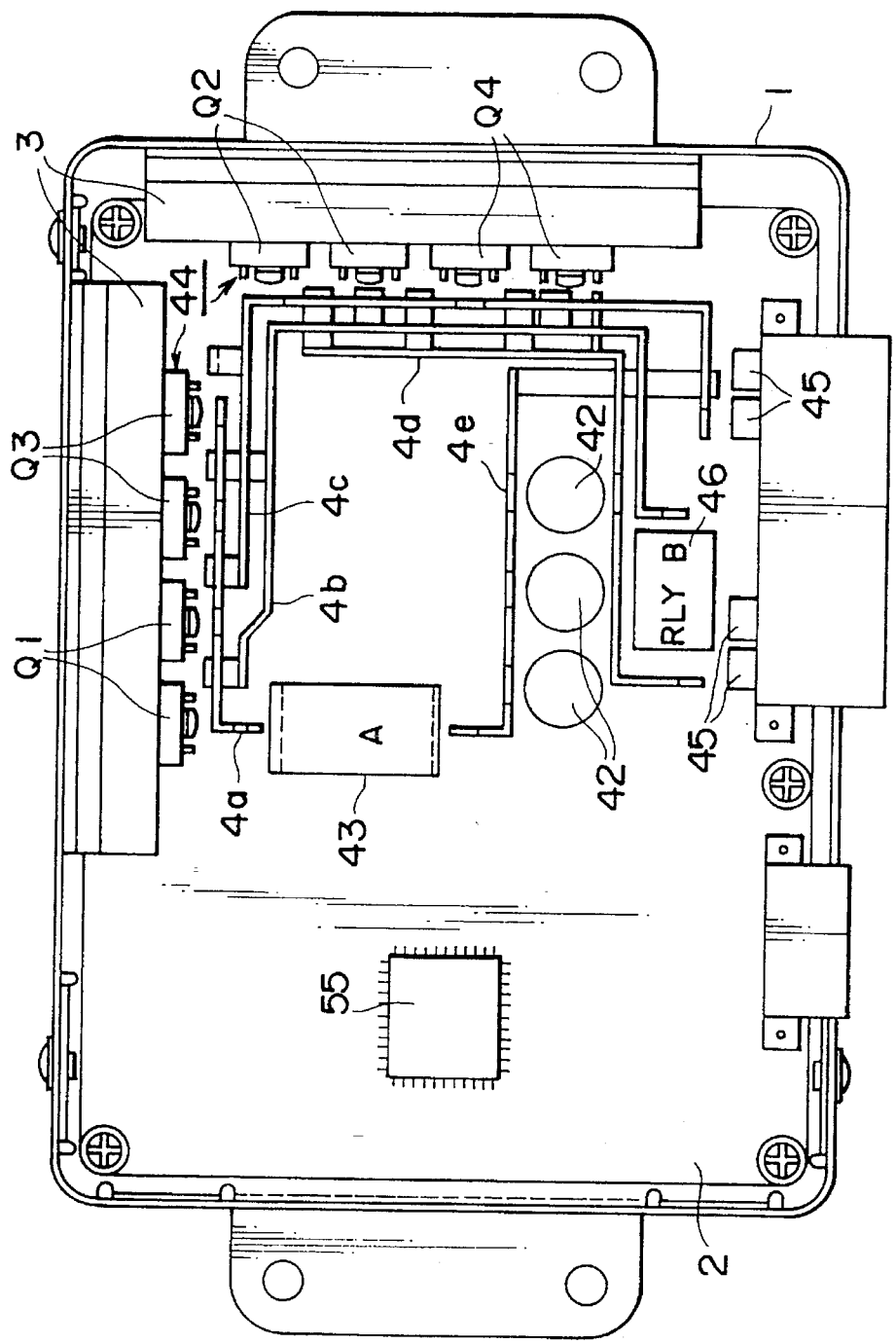
FIG. 4 is a plan view showing the structure of a conventional electric power steering circuit device.

In this embodiment, a microcomputer 55, peripheral circuit elements of a small current such as an interface circuit, a power supply circuit, a logic circuit, and a signal processing circuit, and the drive circuit 47 shown in FIG. 3 are mounted on the insulated printed-circuit board 2. Further, sensor signal connectors (not shown) to be connected to the torque and speed sensors 50 and 51 (see FIG. 3) are provided in the insulated printed-circuit board 2.

Also, heat radiating plate 3A also functions as a shielding plate for the lower portion of the circuit device, and the metal frame 1A is electrically bonded to the heat radiating plate 3 to form a complete shielding structure to shield electromagnetic noise from the insulated printed-circuit board 2.

Semiconductor switching elements Q1 to Q4 are mounted on the heat radiating plate 3A through an insulated plate (not shown). The semiconductor switching elements Q1 to Q4 constituting a bridge circuit 44 comprise, for example, 8 power metal-oxide-semiconductor field-effect transistors covered with resin (two for each).

The heat generated by the semiconductor switching elements Q1 to Q4 is effectively transmitted through the insulated plate to the heat radiating plate 3A, from which heat is radiated to the air.

Reference numerals 14a to 14d denote groups of a plurality of lead terminals of the semiconductor switching elements Q1 to Q4. A lead 14e corresponds to part of a conductive line L3 of the relay 46.

Reference numeral 5 denotes an insulated support member interposed between the heat radiating plate 3A and the insulated printed-circuit board 2. The insulated support member 5 maintains a predetermined space between the heat radiation plate 3A and the insulated printed-circuit board 2, and within the predetermined space, the capacitor 42, the shunt resistor 43, the connector 45, and the relay 46 are mounted.

The insulated printed-circuit board 2 and the heat radiating plate 3A interpose the support member 5 therebetween and are overlapped through a predetermined space.

The capacitors 42 are soldered through an electrode terminal 42a to the wiring patterns P4 and P5 on the support member 5. The electrode terminal 42a on the ground (−) side of the capacitor 42 is connected to the ground terminal of the connector 45, and the electrode terminal 42a on the positive (+) side of the capacitor 42 is connected to the shunt resistor 43.

The connector 45 is mounted in the form of a frame to the support member 5 by monobloc molding such as insert resin molding, and has extension terminal portions 45a at its inner side. Also, the extension terminal portions 45a form part of the wiring patterns P1 to P5, and are electrically connected to the lead terminal groups 14a to 14d.

The outside terminal portions of the connector 45 are to be connected to the motor 40 and the battery 41 through the external wiring patterns L2, as shown in FIG. 3. The connector 45 may be formed of male pins or screw type connection terminals.

The relay contact terminal of the relay 46 on the side of the battery 41 is connected to the battery terminal of the connector 45, while the relay contact terminal on the side of the bridge circuit 44 is connected to the capacitor 42 and the shunt resistor 43 through the lead 42a.

Thus, the large capacity capacitor 42, shunt resistor 43, connector 45 and relay 46 which require a large mounting space, are attached to the support member 5 located at the intermediate layer of the device, and are electrically connected to the lead terminal groups 14a to 14d of the semiconductor switching elements Q1 to Q4 mounted on the heat radiating plate 3A.

Therefore, the degree of structural design freedom between the terminal portions of the capacitor 42, the shunt resistor 43, and the relay 46 and between the extension terminal portions 45a of the connector 45 become large, and the length of the wiring can be shortened compactly and effectively.

Also, the insulated printed-circuit board 2 arranged on the upper portion of the support member 5 effectively saves usable space, so it can be reduced in size.

Also, the metal frame 1A which becomes a shielding plate covers the insulated printed-circuit board 2 completely in cooperation with the heat radiating plate 3A, and reliably interrupts electromagnetic noise which can be input to the insulated printed-circuit board 2.

Embodiment 2

In the first embodiment the insulated printed-circuit board 2 and the heat radiating plate 3A have been spaced from the support member 5, but if the device is constructed so that a predetermined space can only be maintained by the insulated printed-circuit board 2 and the heat radiating plate 3, the support member 5 may be omitted.

Embodiment 3

Even though the relay 46 has been mounted on the support member 5, it may be provided at any external position. In a case where the relay 46 is thus provided at an external position, mounting space is not limited, so this embodiment can cope with a greater current or further reduction in size.

Embodiment 4

While the shunt resistor 43 has been constituted by one shunt resistor and the relay 46 has been constituted by one relay, a plurality of shunt resistors 43 and relays 46 may be connected in parallel in order to cope with a greater current.

Embodiment 5

Further, on the assumption that the motor 40 is a d.c. motor, the bridge circuit 44 has been constituted by four semiconductor switching elements Q1 to Q4, but when a brushless motor is used as a motor 40, the bridge circuit may be constituted by six semiconductor switching elements.

Embodiment 6

If all or part (for example, motor current detection means 48, etc.) of peripheral circuit elements other than the microcomputer 55 are arranged on a flexible substrate which is the conductive lines L3 and L4, the motor current detection means 48 is to be provided near the shunt resistor 43. As a result, the device is excellent in noise-resisting properties and enhanced in accuracy of detection. Further, since peripheral circuit elements are to be arranged in the form of two steps, further miniaturization can be realized.

Many widely different embodiments of the present invention may be constructed without departing from the spirit and scope of the present invention. It should be understood that the present invention is not limited to the specific embodiments described in the specification, except as defined in the appended claims.

What is claimed is:

1. An electric power steering circuit device, comprising:
   a microcomputer;
   a bridge circuit including a plurality of semiconductor switching elements for switching, based on an output signal from said microcomputer, a motor current output by a battery to drive a motor;
   wiring patterns for bridge connecting said plurality of semiconductor switching elements and for flowing a large current, said wiring patterns comprising metal plates fixedly held by molding;
   an insulated printed-circuit board for mounting said microcomputer; and
   a heat radiating plate for mounting said semiconductor switching elements, said heat radiating plate and said insulated printed-circuit board being overlapped through a predetermined space.

2. The electric power steering circuit device as set forth in claim 1, further comprising a support member provided between said heat radiating plate and said insulated printed-circuit board for maintaining said predetermined space, said support member acting to fixedly hold said metal plates.

3. An electric power steering circuit device, comprising:
   a motor for outputting an assisting torque to a steering wheel of a vehicle;
   a battery for supplying a motor current to drive said motor;
   a capacitor for absorbing a ripple component of said motor current supplied by said battery;
   a shunt resistor for detecting said motor current;
   a bridge circuit including a plurality of semiconductor switching elements for switching said motor current according to said, assisting torque;
   wiring patterns for bridge connecting said plurality of semiconductor switching elements and also connecting said shunt resistor and said bridge circuit, said wiring patterns comprising metal plates fixedly held by molding;
   a connector for connecting said motor and said battery to said bridge circuit;
   a torque sensor for sensing a steering torque of said steering wheel;
   a speed sensor for sensing a speed of said vehicle;
   a microcomputer with peripheral circuit elements for calculating said assisting torque based on said steering torque of said steering wheel and said speed of said vehicle and for generating, based on a signal fed back thereto representing said motor current, a drive signal for controlling said bridge circuit;
   conductive lines for connecting said microcomputer and said peripheral circuit elements to said bridge circuit;
   an insulated printed-circuit board for mounting thereon said microcomputer and said peripheral circuit elements; and
   a heat radiating plate for mounting thereon said semiconductor switching elements, said heat radiating plate and said insulated printed-circuit board being overlapped through a predetermined space.

4. The electric power steering circuit device as set forth in claim 3, further comprising a support member provided between said heat radiating plate and said insulated printed-circuit board for maintaining said predetermined space, said support member acting to fixedly hold said metal plates.

5. The electric power steering circuit device as set forth in claim 4, wherein said capacitor and said shunt resistor are attached to said metal plates fixedly held by said support member.

6. The electric power steering circuit device as set forth in claim 4 or 5, wherein said connector is integrally formed with said support member and has extension terminal portions, said extension terminal portions forming part of said wiring patterns and being connected to leads of said semiconductor switching elements mounted on said heat radiating plate.

7. The electric power steering circuit device as set forth in any one of claims 3 through 5, wherein said conductive lines comprise a flexible substrate.

8. The electric power steering circuit device as set forth in any one of claims 1 through 5, wherein said insulated printed-circuit board is covered with a shielding plate for shielding electromagnetic noise.

9. The electric power steering circuit device as set forth in claim 7, wherein at least part of said peripheral circuit elements are arranged on said flexible substrate.

* * * * *